United States Patent
Oh et al.

(10) Patent No.: US 8,303,197 B2
(45) Date of Patent: Nov. 6, 2012

(54) METHOD OF DEVELOPING A SUBSTRATE AND APPARATUS FOR PERFORMING THE SAME

(75) Inventors: Doo-Young Oh, Cheonan-si (KR); In-Cheol Ryu, Jeongeup-si (KR)

(73) Assignee: Semes Co., Ltd., Chungnam (KR)

( * ) Notice: Subject to any disclaimer, the term of this patent is extended or adjusted under 35 U.S.C. 154(b) by 1107 days.

(21) Appl. No.: 12/198,153

(22) Filed: Aug. 26, 2008

(65) Prior Publication Data

US 2009/0060493 A1 Mar. 5, 2009

(30) Foreign Application Priority Data

Aug. 31, 2007 (KR) .................. 10-2007-0088002

(51) Int. Cl.
*G03D 3/02* (2006.01)
*G03D 5/00* (2006.01)

(52) U.S. Cl. ........ 396/627; 396/604; 396/611; 396/628; 396/631

(58) Field of Classification Search .............. 396/627, 396/564, 604, 611, 628, 631
See application file for complete search history.

(56) References Cited

U.S. PATENT DOCUMENTS

| | | | |
|---|---|---|---|
| 6,089,762 A * | 7/2000 | Mimasaka et al. | 396/611 |
| 6,384,894 B2 | 5/2002 | Matsuyama et al. | |
| 2006/0185543 A1* | 8/2006 | Sasayama | 101/463.1 |

FOREIGN PATENT DOCUMENTS

| | | |
|---|---|---|
| JP | 10-340836 | 12/1998 |
| JP | 2000-061377 | 2/2000 |
| JP | 200061377 | 2/2000 |
| JP | 2000-68188 | 3/2000 |
| JP | 2003-324064 | 11/2003 |
| JP | 3580664 | 10/2004 |
| KR | 10-1998-079565 | 11/1998 |
| KR | 1020060035471 A | 4/2006 |

OTHER PUBLICATIONS

Korean Office Action for Korean Patent Application No. 2007-88002 dated Jul. 15, 2008, 6 pages, from which present U.S. Application claims priority.
Japanese Office Action dated Dec. 21, 2010 for Japanese Patent Application No. 2008-222103, pp. 1-7.
Japanese Office Action dated Jul. 11, 2011 for Japanese Patent Application No. 2011-95484, and English summary, 6 pages.
Chinese Office Action for Chinese Patent Application No. 200810212716.2 (and English Summary) dated Nov. 1, 2010, 8 pages, which is a counterpart to the present U.S. Application.

* cited by examiner

*Primary Examiner* — Rochelle-Ann J Blackman
(74) *Attorney, Agent, or Firm* — Daly, Crowley, Mofford & Durkee, LLP

(57) ABSTRACT

In an apparatus for performing a substrate developing process, a first washing tank and a second washing tank are disposed on both sides of a substrate support section for supporting the substrate opposite to each other to wash a developing nozzle. The developing nozzle moves in a horizontal direction from the first washing tank toward the second washing tank and supplies a developing solution onto the substrate in the meantime. After supplying the developing solution, the developing nozzle is received in the second washing tank, and the developing solution adhered to the developing nozzle is removed by a washing solution in the second washing tank.

6 Claims, 4 Drawing Sheets

METHOD OF DEVELOPING A SUBSTRATE AND APPARATUS FOR PERFORMING THE SAME

PRIORITY STATEMENT

This application claims priority under 35 U.S.C. §119 to Korean Patent Application No. 2007-88002, filed on Aug. 31, 2007 in the Korean Intellectual Property Office (KIPO), the contents of which are herein incorporated by reference in their entirety.

BACKGROUND

1. Field

The example embodiments relate generally to a method of developing a substrate, and an apparatus for performing the same. More particularly, the example embodiments relate to a method of developing a substrate by supplying a developing solution onto the substrate, and an apparatus for performing the same.

2. Description of the Related Art

In a semiconductor or flat panel display processing technology, circuit patterns may be formed on a substrate such as a semiconductor wafer and a glass substrate by a photolithography process.

The photolithography technique may include a coating process for supplying a photoresist composition onto a substrate to form a photoresist film on the substrate, a baking process for hardening the photoresist film, an exposure process for transcribing circuit patterns of a mask onto the photoresist film, and a developing process for forming circuit patterns on the substrate using a developing solution.

Generally, an apparatus for performing the developing process may include a spin chuck to support a substrate, which is subjected to an exposure process, and a nozzle to supply a developing solution onto the substrate. The nozzle has a length longer than the diameter of the substrate and is movably disposed above the support. That is, the nozzle may supply the developing solution onto the substrate while moving in a direction parallel to an upper surface of the substrate. An example of the developing apparatus is disclosed in U.S. Pat. No. 6,384,894.

In accordance with U.S. Pat. No. 6,384,894, a washing tank is disposed on one side of the substrate supported by the spin chuck to wash the nozzle, and the nozzle supplies the developing solution onto the substrate while moving from the washing tank toward another side of the substrate in a direction parallel to the upper surface of the substrate. However, while the nozzle is returned to the washing tank, the developing solution drips from the nozzle onto the substrate, and developing defects or line width defects may thus occur.

To solve the above-mentioned problems, while returning the nozzle to the washing tank, the developing solution may be supplied onto the substrate. In such a case, the developing solution may be adhered to a lower portion of the nozzle while moving the nozzle to the another side of the substrate. The developing solution adhered to the nozzle may be transferred onto the substrate, and developing defects or line width defects may thus occur.

Further, while moving the nozzle to the another side of the substrate, the developing solution may not be supplied. In such a case, the time required to perform a developing process may be increased.

SUMMARY

Example embodiments of the present invention provide a method of developing a substrate capable of reducing developing defects and line width defects and shortening the time required to perform a developing process.

Further, example embodiments of the present invention provide an apparatus for developing a substrate capable of reducing developing defects and line width defects and shortening the time required to perform a developing process.

In accordance with some example embodiments of the present invention, a method of developing a substrate may include separating a developing nozzle from a first washing tank disposed on one side of the substrate, which is supported by a substrate support section; supplying a developing solution onto the substrate while moving the developing nozzle in a horizontal direction toward a second washing tank disposed on another side of the substrate; receiving the developing nozzle into the second washing tank; and washing the developing nozzle in the second washing tank.

In accordance with some example embodiments of the present invention, a cup disposed around the substrate may be moved upward so that the substrate is surrounded by the cup after supplying the developing solution, and a cleaning solution may then be supplied onto the substrate to clean the substrate onto which the developing solution is supplied. The substrate cleaned by the cleaning solution may be dried, and the cup may then be moved downward.

In accordance with some example embodiments of the present invention, a method of developing a substrate may include first supplying a developing solution onto the substrate, which is supported by a substrate support section, while moving a developing nozzle in a first horizontal direction from a first washing tank disposed on one side of the substrate toward a second washing tank disposed on another side of the substrate; first washing the developing nozzle in the second washing tank; second supplying the developing solution onto the substrate while moving the developing nozzle in a second horizontal direction from the second washing tank toward the first washing tank; and second washing the developing nozzle in the first washing tank.

In accordance with some example embodiments of the present invention, the substrate may be first cleaned after first supplying the developing solution, and the substrate may be second cleaned after second supplying the developing solution. Further, the substrate may be dried after second cleaning the substrate.

In accordance with some example embodiments of the present invention, an apparatus for developing a substrate may include a substrate support section for supporting the substrate; a developing nozzle movable in a horizontal direction above the substrate supported by the substrate support section to supply a developing solution onto the substrate; a first washing tank disposed on one side of the substrate support section to wash the developing nozzle; and a second washing tank disposed on another side of the substrate support section to wash the developing nozzle.

In accordance with some example embodiments of the present invention, the substrate developing apparatus may further include a first washing solution supply section connected to the first washing tank to supply a washing solution into the first washing tank to wash the developing nozzle; and a second washing solution supply section connected to the second washing tank to supply a washing solution into the second washing tank to wash the developing nozzle.

In accordance with some example embodiments of the present invention, the substrate developing apparatus may further include a cup disposed around the substrate support section and movable upward and downward.

In accordance with the example embodiments of the present invention, after a developing solution is supplied onto a substrate, a developing nozzle may be washed in a first or second washing tank. Thus, the developing solution may be prevented from dripping from the developing nozzle onto the substrate. As a result, problems due to dripping of the developing solution may be prevented.

Further, there is no necessity for moving the developing nozzle to wash the developing nozzle or to prevent dripping of the developing solution. Thus, the time required to perform a developing process may be shortened.

BRIEF DESCRIPTION OF THE DRAWINGS

Example embodiments of the present invention will become readily apparent along with the following detailed description when considered in conjunction with the accompanying drawings, in which.

DESCRIPTION OF THE EMBODIMENTS

Figure 1:
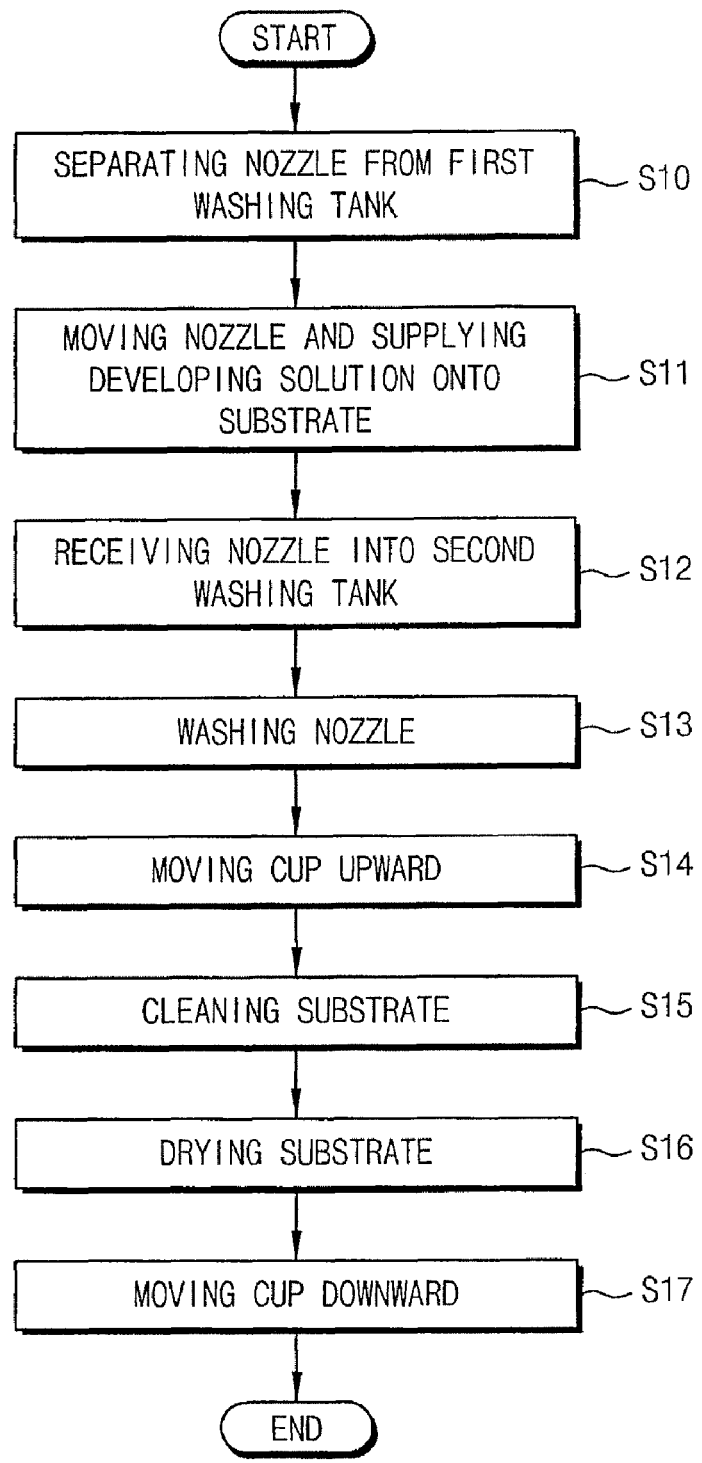
FIG. 1 is a flowchart illustrating a method of developing a substrate in accordance with an example embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present invention.

Figure 2:
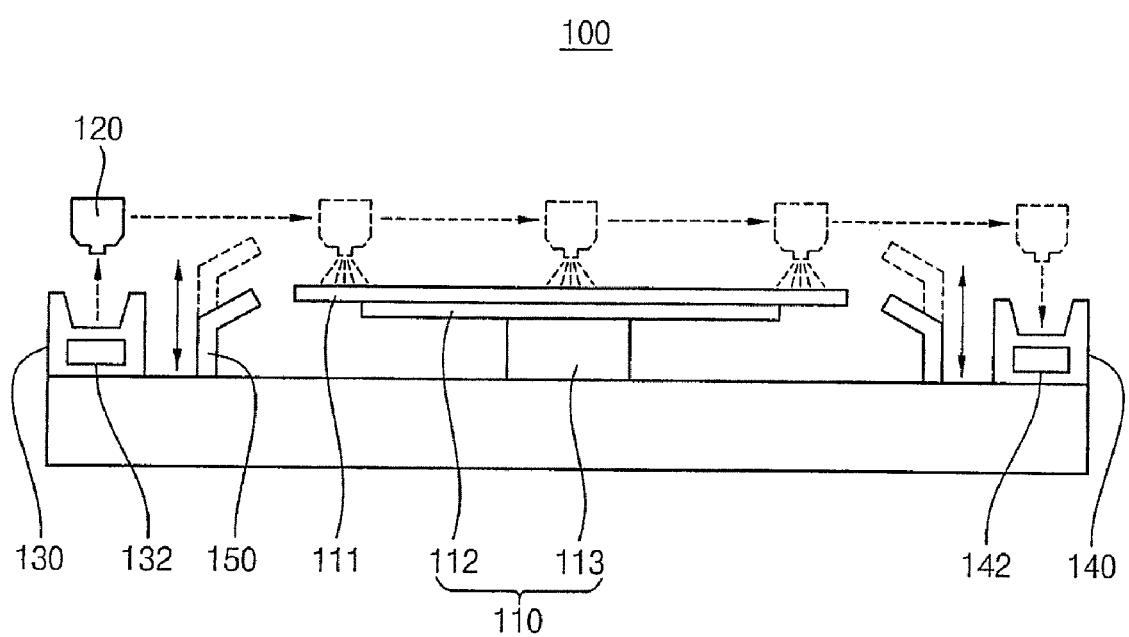
FIG. 2 is a schematic view illustrating an apparatus for performing the method shown in FIG. 1.

FIG. 1 is a flowchart illustrating a method of developing a substrate in accordance with an example embodiment of the present invention, and FIG. 2 is a schematic view illustrating an apparatus for performing the method shown in FIG. 1.

Referring to FIGS. 1 and 2, an apparatus 100 for developing a substrate may be employed to perform a developing process on a semiconductor substrate such as a silicon wafer or a glass substrate. The substrate developing apparatus 100 may include a substrate support section 110, a developing nozzle 120, a first washing tank 130 and a second washing tank 140.

The substrate support section 110 may include a support member 112 for supporting a substrate 111 and a driving shaft 113 connected to a lower portion of the support member 112. The driving shaft 113 may be connected with a motor (not shown) to rotate the substrate 111 to perform a cleaning process and a drying process on the substrate 111.

The developing nozzle 120 may supply a developing solution onto the substrate 111 supported by the substrate support section 110. The developing nozzle 120 may movably disposed in a horizontal direction and a vertical direction by a driving section (not shown). Particularly, the driving section may be moved the developing nozzle 120 in a direction parallel to an upper surface of the substrate 111 to supply the developing solution onto the substrate 111.

The developing nozzle 120 may longitudinally extend in another horizontal direction perpendicular to the horizontal direction and may have a slit (not shown) to supply the developing solution onto the substrate 111. Particularly, the developing nozzle 120 may have a length longer than the diameter or the width of the substrate 111.

In accordance with another example embodiment of the present invention, the developing nozzle 120 may have a plurality of holes that may be arranged in a longitudinal direction of the developing nozzle 120 to supply the developing solution onto the substrate 111.

The developing nozzle 120 may be connected with a developing solution supply section (not shown) via a developing solution supply pipe (not shown) and may supply the developing solution onto the substrate 111 while moving in the horizontal direction above the substrate 111.

The first washing tank 130 and the second washing tank 140 may each be disposed on both sides of the substrate support section 110 opposite to each other. That is, the first washing tank 130 may be disposed on one side of the substrate 111 supported by the substrate support section 110, and the second washing tank 140 may be disposed on another side of the substrate 111 supported by the substrate support section 110. The first washing tank 130 and the second washing tank 140 may serve as standby ports in which the developing nozzle 120 wait for the developing process.

The first washing tank 130 and the second washing tank 140 may receive a washing solution to remove the developing solution adhered to a lower portion of the developing nozzle 120. That is, each of the first and second washing tanks 130 and 140 has an interior space for receiving the washing solution and an open upper portion. Further, a first washing solution supply section 132 and a second washing solution supply section 142 for supplying the washing solution may be connected with the first washing tank 130 and the second washing tank 140, respectively. The developing nozzle 120 may be inserted into the first or second washing tank 130 or 140 through the open upper portion of the first or second washing tank 130 or 140, and the developing solution adhered to the developing nozzle 120 may be removed by the washing solution.

The developing nozzle 120 may be moved in a first horizontal direction from the first washing tank 130 toward the second washing tank 140 or in a second horizontal direction from the second washing tank 140 toward the first washing tank 130 and may supply the developing solution onto the substrate 111 in the meantime.

Before or after supplying the developing solution, the developing nozzle 120 may stand by in the first washing tank 130 or the second washing tank 140. Here, the developing nozzle 120 may be washed by the washing solution received in the first washing tank 130 or the second washing tank 140.

Meanwhile, the substrate developing apparatus 100 may further include a cup 150 disposed between the substrate support section 110 and the first and second washing tanks 130 and 140. The cup 150 may be movable in a vertical direction. For example, the cup 150 may be lifted up so as to surround the substrate 111 supported by the substrate support section 110.

After performing the developing process on the substrate 111, a cleaning solution may be supplied onto the substrate 111. Further, the substrate 111 may be rotated by the substrate support section 110 to remove the cleaning solution and to dry the substrate 111, and the cup 150 may be lifted up to block the cleaning solution separated from the substrate 111 by centrifugal force.

A method of developing a substrate in accordance with an example embodiment of the present invention will be described more fully hereinafter with reference to FIGS. 1 and 2.

A substrate 111 subjected to an exposure process may be loaded on the substrate support section 110. Here, the developing nozzle 120 may stand by in the first washing tank 130.

In step S10, the developing nozzle 120 may be separated from the first washing tank 130. For example, the developing nozzle 120 may be moved upward by the driving section.

In step S11, the developing nozzle 120 may be moved in the first horizontal direction from the first washing tank 130 toward the second washing tank 140 by the driving section, and the developing solution may be supplied onto the substrate 111 in the meantime. Here, a gap between the substrate 111 and the developing nozzle may be about 1 mm to about 2 mm.

In step S12, the developing nozzle 120 may be received into the second washing tank 140. That is, the driving section may be moved downward the developing nozzle 120 so that the lower portion of the developing nozzle 120 is immersed in the washing solution received in the second washing tank 140.

In step S13, the developing nozzle may be washed by the washing solution in the second washing tank 140 while the developing nozzle 120 stands by in the second washing tank 140. The developing solution adhered to the developing nozzle 120 may be removed by the washing solution.

As described above, after supplying the developing solution onto the substrate 111, the developing nozzle 120 may stand by in the second washing tank 140. Thus, there is no necessity for returning the developing nozzle 120 to the first washing tank 130. That is, an unnecessary step of moving the developing nozzle 120 may be removed. As a result, problems that may be caused by the unnecessary step of moving the developing nozzle 120, for example, developing defects, line width defects, and the like, may be removed, and the time required to perform a developing process may be shortened.

Meanwhile, the developing nozzle may be moved in the second horizontal direction from the second washing tank 140 toward the first washing tank 130 to supply the developing solution onto a subsequent substrate.

In step S14, the cup 150 may be moved upward so that the substrate 111 is surrounded by the cup 150.

In step S15, the cleaning solution may be supplied onto the substrate 111 to clean the substrate 111. The cleaning solution may be supplied onto a central portion of the substrate 111 from a cleaning nozzle (not shown), and the substrate 111 may be rotated at a predetermined speed. Here, the cleaning solution separated from the substrate 111 by centrifugal force may be blocked by the cup 150.

In step S16, after performing the cleaning step S15, the substrate 111 may be rotated at a predetermined speed and may thus be dried.

In step S17, the cup 150 may be moved downward, and the substrate 111 may then be unloaded from the substrate support section 110 by a substrate transferring section (not shown).

Figure 3:
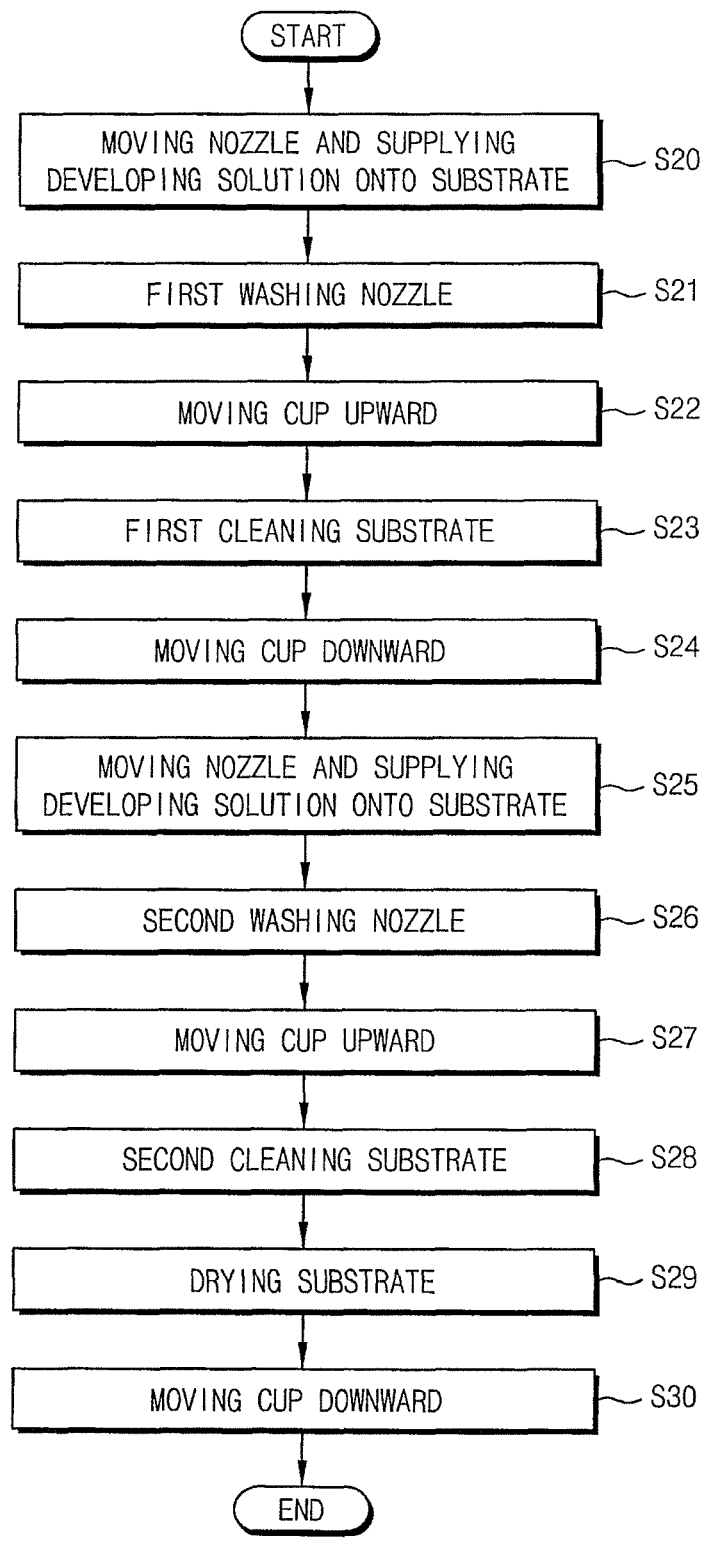
FIG. 3 is a flowchart illustrating a method of developing a substrate in accordance with another example embodiment of the present invention.
Figure 4:
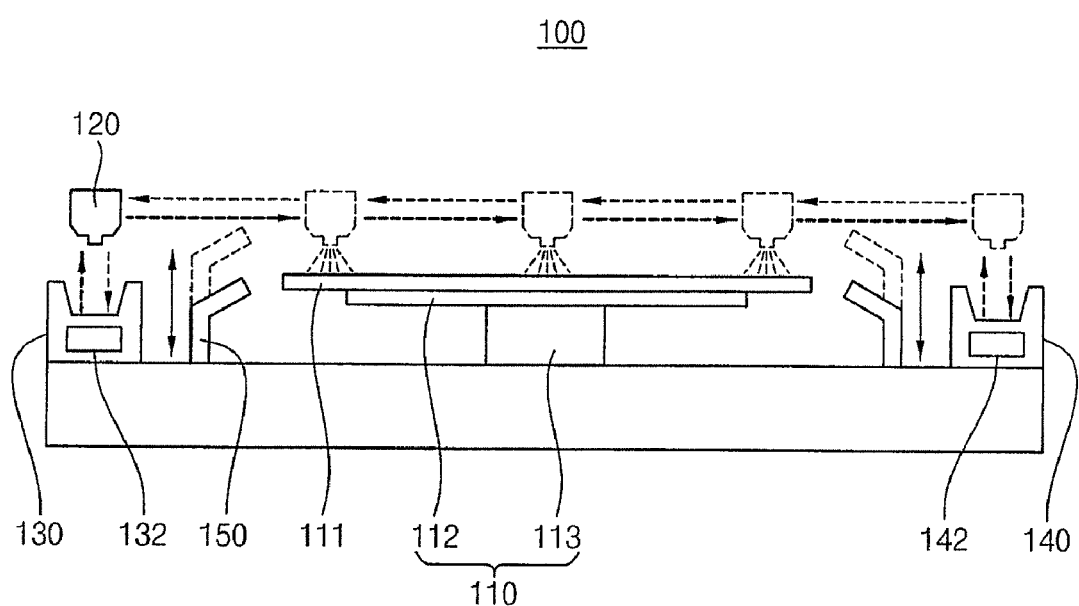
FIG. 4 is a schematic view illustrating the substrate developing method shown in FIG. 3.

FIG. 3 is a flowchart illustrating a method of developing a substrate in accordance with another example embodiment of the present invention, and FIG. 4 is a schematic view illustrating the substrate developing method shown in FIG. 3.

Referring to FIGS. 3 and 4, a substrate 111 subjected to an exposure process may be loaded on the substrate support section 110. Here, the developing nozzle 120 may stand by in the first washing tank 130.

In step S20, the developing nozzle 120 may be separated from the first washing tank 130, and the developing nozzle 120 may then be moved in the first horizontal direction from the first washing tank 130 toward the second washing tank 140 by the driving section. Further, the developing solution may be first supplied onto the substrate 111 while the developing nozzle 120 is moved in the first horizontal direction.

In step S21, the developing nozzle 120 may be received into the second washing tank 140. The developing nozzle 120 may be first washed by the washing solution received in the second washing tank 140 while the developing nozzle 120 stands by in the second washing tank 140. That is, the developing solution adhered to the developing nozzle 120 may be removed by the washing solution.

In step S22, the cup 150 may be moved upward so that the substrate 111 is surrounded by the cup 150.

In step S23, the cleaning solution may be supplied onto the substrate 111 to first clean the substrate 111. The cleaning solution may be supplied onto a central portion of the substrate 111 from a cleaning nozzle (not shown), and the substrate 111 may be rotated at a predetermined speed. Here, the cleaning solution separated from the substrate 111 by centrifugal force may be blocked by the cup 150.

In step S24, the cup 150 may be moved downward.

In step S25, the developing nozzle 120 may be separated from the second washing tank 140, and the developing nozzle 120 may then be moved in the second horizontal direction from the second washing tank 140 toward the first washing tank 130 by the driving section. Further, the developing solution may be second supplied onto the substrate 111 while the developing nozzle 120 is moved in the second horizontal direction. Here, because the developing solution adhered to the developing nozzle during the first developing step S20 is removed, the problems such as developing defects and line width defects may not occur.

In step S26, the developing nozzle 120 may be received into the first washing tank 130. The developing nozzle 120 may be second washed by the washing solution received in the first washing tank 130 while the developing nozzle 120 stands by in the first washing tank 130.

In step S27, the cup 150 may be moved upward so that the substrate 111 is surrounded by the cup 150.

In step S28, the cleaning solution may be supplied onto the substrate 111 to second clean the substrate 111, and the substrate 111 may be rotated at a predetermined speed.

In step S29, after performing the second cleaning step S28, the substrate 111 may be rotated at a predetermined speed and may thus be dried.

In step S30, the cup 150 may be moved downward, and the substrate 111 may then be unloaded from the substrate support section 110 by a substrate transferring section (not shown).

In accordance with the example embodiments of the present invention, after a developing solution is supplied onto a substrate, a developing nozzle may be washed in a first or second washing tank. Thus, the developing solution may be prevented from dripping from the developing nozzle onto the substrate. As a result, developing defects or line width defects due to dripping of the developing solution may be prevented.

Further, there is no necessity for moving the developing nozzle to wash the developing nozzle or to prevent dripping of the developing solution. Thus, the time required to perform a developing process may be shortened.

Although the example embodiments of the present invention have been described, it is understood that the present invention should not be limited to these example embodiments but various changes and modifications can be made by those skilled in the art within the spirit and scope of the present invention as hereinafter claimed.

What is claimed is:

1. A method of developing a substrate comprising:
    separating a developing nozzle from a first washing tank disposed on one side of the substrate to a first position directly above the first washing tank, which is supported by a substrate support section;
    supplying a developing solution onto the substrate while moving the developing nozzle in a horizontal direction from the first position to a second position directly above a second washing tank disposed on another side of the substrate;
    receiving the developing nozzle into the second washing tank;
    washing the developing nozzle in the second washing tank;
    moving upward a cup disposed around the substrate support section so that the substrate is surrounded by the cup after supplying the developing solution;
    cleaning the substrate onto which the developing solution is supplied;
    drying the cleaned substrate; and
    moving downward the cup.

2. The method of claim 1, further comprising washing the developing nozzle in the first washing tank.

3. A method of developing a substrate comprising:
    first supplying a developing solution onto the substrate, which is supported by a substrate support section, while moving a developing nozzle in a first horizontal direction from a first position directly above a first washing tank disposed on one side of the substrate to a second position directly above a second washing tank disposed on another side of the substrate;
    first washing the developing nozzle in the second washing tank;
    second supplying the developing solution onto the substrate while moving the developing nozzle in a second horizontal direction from the second washing tank toward the first washing tank; and
    second washing the developing nozzle in the first washing tan.

4. The method of claim 3, further comprising:
    first cleaning the substrate after first supplying the developing solution;
    second cleaning the substrate after second supplying the developing solution; and
    drying the substrate after second cleaning the substrate.

5. An apparatus for developing a substrate comprising:
    a substrate support section for supporting the substrate;
    a developing nozzle movable in a horizontal direction above the substrate supported by the substrate support section to supply a developing solution onto the substrate;
    a first washing tank disposed on one side of the substrate support section to wash the developing nozzle; and
    a second washing tank disposed on another side of the substrate support section to wash the developing nozzle; and
    a cup disposed around the substrate support section and movable upward and downward.

6. The apparatus of claim 5, further comprising:
    a first washing solution supply section connected to the first washing tank to supply a washing solution into the first washing tank to wash the developing nozzle; and
    a second washing solution supply section connected to the second washing tank to supply a washing solution into the second washing tank to wash the developing nozzle.

* * * * *